United States Patent [19]
Chow

[11] Patent Number: 5,991,209
[45] Date of Patent: *Nov. 23, 1999

[54] SPLIT SENSE AMPLIFIER AND STAGING BUFFER FOR WIDE MEMORY ARCHITECTURE

[75] Inventor: Lap-Wai Chow, So. Pasadena, Calif.

[73] Assignee: Raytheon Company, Lexington, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/827,856

[22] Filed: Apr. 11, 1997

[51] Int. Cl.$^6$ .................................................. G11C 16/04
[52] U.S. Cl. ...................... 365/189.05; 365/205; 365/208
[58] Field of Search ............................. 365/189.05, 205, 365/208, 190

[56] References Cited

U.S. PATENT DOCUMENTS

| | | | |
|---|---|---|---|
| 5,311,469 | 5/1994 | Hoshi | 365/208 |
| 5,311,471 | 5/1994 | Matsumoto | 365/208 |
| 5,341,341 | 8/1994 | Fukuzo | 365/189.05 |
| 5,418,737 | 5/1995 | Tran | 365/208 |
| 5,537,352 | 7/1996 | Meyer | 365/189.05 |
| 5,726,943 | 3/1998 | Yamagat | 365/208 |

*Primary Examiner*—A. Zarabian
*Attorney, Agent, or Firm*—Leonard A. Alkov; Glenn H. Lenzen, Jr.

[57] ABSTRACT

In an amplifier design for a wide memory architecture, a staging buffer can be integrated with the final stage of a multi-stage sense amplifier. The staging buffer includes a memory latch for storing at least one bit of data. The data is transferred into the staging buffer from memory upon strobing at least one read enable line, and transferred from the staging buffer to a data bus upon strobing at least one write enable line. The data signal is transferred from the memory to the staging buffer at a voltage level lower than the full swing voltage level. The memory architecture produced using this design technique allows for a much lower voltage swing on all of the data lines, thus lowering the power requirements of the circuit.

17 Claims, 3 Drawing Sheets

SPLIT SENSE AMPLIFIER AND STAGING BUFFER FOR WIDE MEMORY ARCHITECTURE

BACKGROUND OF THE INVENTION

1. Technical Field

This invention generally relates to an amplifier design. More particularly, the present invention relates to a split sense amplifier and a staging buffer suitable for use with high speed memory architectures.

2. Discussion

The application of sense amplifiers and staging buffers in highly integrated memory architectures is generally known within the electronics art. As the requirement for larger and significantly faster memory architectures increases, circuit designers are forced to produce memory chips with ever increasing numbers of transistors which form these memory locations. Furthermore, integrated memory circuits require additional transistor based circuitry to support the larger memory architectures. The performance of this supporting circuitry becomes even more important when the memory chips are switched or clocked at the increased speeds associated with high throughput microprocessors. As such, these memory architectures require larger amounts of power, which in turn creates additional problems for integrated circuit designers. Examples of these problems are increased noise propagation and higher capacitive loading placed upon the data bus channels.

To overcome the problems with the capacitive loads associated with the data bus channels, sense amplifiers were incorporated within the integrated memory circuit to drive the digital logic voltage signals between the two logic states, typically between 0 volts and 5.0 volts. The sense amplifier was designed to determine the logic state of a particular low voltage data signal stored in memory by comparing the voltage levels of the data signal against preset threshold parameters, and then driving the particular data signal to the appropriate 0 volt or 5.0 volt signal level, also referred to as the full swing voltage level. However, the technique of transferring the data signals from memory to other circuits at the full swing voltage level provided by the sense amplifiers required additional power. This power was not always available, or if available, created excess heat which had to be dissipated from the chip. One way of reducing power was to reduce the voltage swing level from 5.0 volts to 3.3 volts. However, the power reduction achieved by this change was soon lost through the addition of more transistors.

Additionally, as the demand for more complex signal processors increases, so does the demand for wider memory architectures. For example, FFT processors and vector processors are typically based upon highly parallel computer architectures. This means that the conventional 32 and 64 bit data bus channels associated with current high performance microprocessors will be replaced with a data bus including from 500 to 4,000 data channels. This increase in the number of data channels, or strip transmission lines formed on the silicon chip, also significantly increases the total load placed on the circuit.

To assist these highly parallel processors in operating more efficiently, staging buffers were added to the memory architectures supporting these processors. While the addition of staging buffers achieved the goal of increasing processor throughput and efficiency, the staging buffers coupled to the sense amplifiers will potentially increase the loading placed upon the memory circuit, and accordingly increase the total power consumed by the memory circuit.

Thus, it is desirable to provide a high density memory architecture which can implement staging buffers integrated within a conventional sense amplifier for reducing the power consumed by the memory circuit. Such a reduction could be achieved by transferring the data signal from the sense amplifier to the staging buffer at voltage levels significantly lower than the typical full swing voltage level. This technique would serve to significantly reduce the amount of power consumed by the memory circuit and accordingly allows more transistors to be integrated into a single integrated circuit package.

The conventional approach to designing the interface between a wide memory architecture and its high speed staging buffers is to have a separate multi-stage sense amplifier provide a full swing voltage signal onto the data bus, and transfer the full swing voltage signal across the data bus to the staging buffers which act as a register to store these data values. Since the wide memory architecture associated with parallel processors requires a large number of data bus channels, and therefore staging buffers (typically between 500 and 4,000), and because the capacitive loading of each of these channels is relatively high, the switching power of these data bus channels becomes a significant portion of the total power consumed by the memory circuit. This level of power consumption only increases when the switching frequency of the memory circuit is increased. Accordingly, it is desirable to provide a sense amplifier and staging buffer design which is capable of reducing this power by at least one order of magnitude without paying a significant penalty in performance or heat and noise generation.

SUMMARY OF THE INVENTION

In accordance with the teachings of the present invention, the staging buffer can be integrated with the final stage of a multi-stage sense amplifier. In effect, the addition of the staging buffer to the sense amplifier does not increase the complexity of the design, since it efficiently combines the functions of the staging buffer and the final stage of the sense amplifier. This technique reduces the number of transistors, and thus reduces the power required by the memory circuit. In the preferred embodiment, each data line connecting the memory to the parallel processor is provided with a single sense amplifier, and one or more staging buffers which communicate with the sense amplifier through a common data bus. The data bits stored in memory can then be pre-loaded into the staging buffers prior to being used by the appropriate vector unit of a vector processor. The intermediate results produced by each vector unit can then be efficiently stored back into the staging buffers.

The present invention also is capable of reducing the routing complexity of the data bus channels. By eliminating the requirement for a separate staging buffer circuit, this technique significantly reduces the number of strip transmission lines, which in turn reduces the capacitive load placed on the data bus channels. The memory architecture produced using this design technique also allows for a much lower voltage swing on all of the data bus channels, thus further lowering the power requirements of the memory circuit.

BRIEF DESCRIPTION OF THE DRAWINGS

Additional objects, advantages and features of the present invention will become apparent from the following description and appended claims, taken in conjunction with the accompanying drawings in which:

DETAILED DESCRIPTION OF THE PREFERRED EMBODIMENTS

Figure 1:
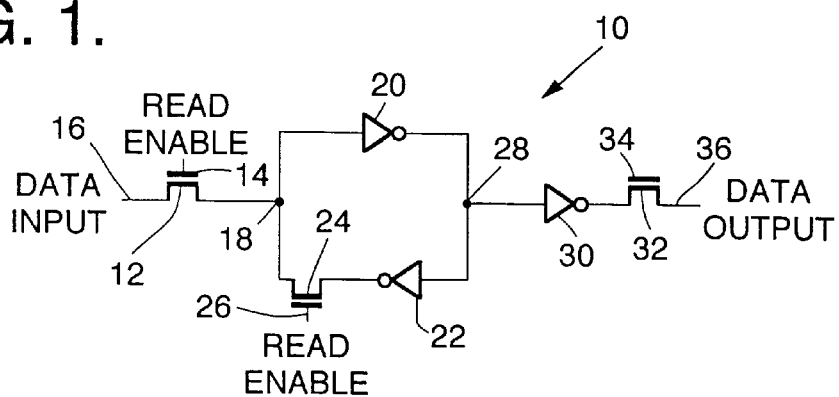
FIG. 1 is a schematic diagram of an exemplary staging buffer which may be used with high speed memory architectures.

The following description of the preferred embodiments is merely exemplary in nature and is in no way intended to limit the invention, its applications or uses. Additionally, where appropriate in the detailed description like elements are identified with like reference numerals.

The present invention is directed to a memory device which is capable of temporarily storing the data for multiple, simultaneously operating, vector units which form a parallel or vector process. To enhance the efficiency of the parallel process, staging buffers are employed as an intermediate storage cell for each data bit. Rather than having each vector unit of the parallel process read/write the data bits from/to a register file, the vector units read/write their intermediate results from/to dedicated staging buffers. This technique serves to eliminate the transfer of intermediate computational data across the primary data bus, and thus allows the parallel process to operate with significantly higher throughput. The requirement for the efficient transfer of intermediate data is an increasing concern with highly parallel vector and FFT processors. However, the use of staging buffers in addition to all of the other circuitry, such as sense amplifiers, required to support high speed memory is not always possible because of space and power limitations of the integrated circuit. Accordingly, the sense amplifier and staging buffer design of the present invention allows these two functions to be combined, thereby providing a high speed staging buffer memory cell without increasing the power and density requirements of the memory circuit.

Referring now to FIG. 1, a conventional staging buffer which is well suited for use as an intermediate storage cell is shown. In a conventional memory architecture, staging buffer 10 is disposed along each data line 16 of the data bus. Transistor 12, connected between data line 16 and node 18, allows the transfer of data between the data bus and the staging buffer 10 and is controlled by read enable line 14. The staging buffer circuit 10 includes a first inverter 20 and a second inverter 22 connected end-to-end, with the output of second inverter 22 connected to the input of first inverter 20 through transistor 24, which is operated by a complementary read enable line $\overline{RE}$ 26. As disclosed, transistors 12 and 24 will always be held in opposite switched states because of the complementary logic signals presented on read enable line 14 and inverse read enable line 26. The output of first inverter 20 is fed to the input of a third inverter 30 at node 28. The output of third inverter 30 connects to the data output line 36 through transistor 32, which is switched on and off through output enable line 34.

This conventional staging buffer 10 operates as a memory cell or latch when a particular data value is written to the staging buffer 10. In operation, the staging buffer 10 can read and store one bit of data from data line 16 when read enable transistors 12 and 24 are simultaneously turned on and off respectively. The latch circuit created by invertors 20 and 22 memorize the logic value from data line 16, and will remain indefinitely at the acquired logic state after read enable transistors 12 and 24 are turned off and on, respectively. The stored data value can be transferred from staging buffer 10 to the data output line 36 by switching on transistor 32 through output enable line 34. Alternatively, one skilled in the art will recognize that the combination of inverter 30 and transistor 32 can be effectively replaced by an inverting tri-state buffer without changing the operation of the circuit.

Figure 2:
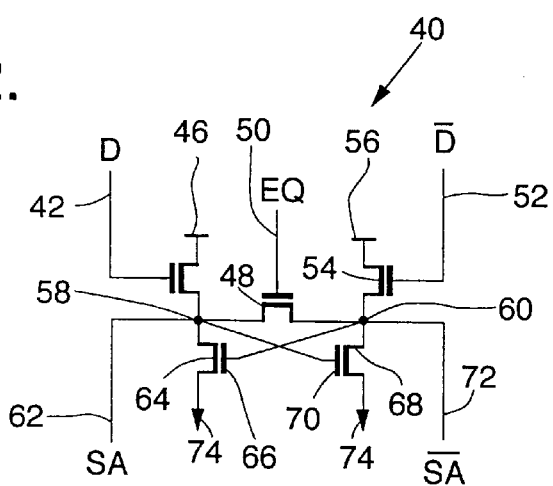
FIG. 2 is a schematic diagram of the first stage of the split sense amplifier and staging buffer in accordance with a preferred embodiment of the present invention.

FIG. 2 depicts the first stage sense amplifier 40 of a two stage sense amplifier used with the preferred implementation of the present invention. First stage sense amplifier 40 includes a data line 42 connected to the gate of transistor 44, which has its drain connected to the appropriate true logic voltage 46, preferably 3.3V. A complementary data line ($\overline{D}$) 52 is connected to the gate of transistor 54. The drain of transistor 54 is also connected to the true logic voltage source 56, preferably 3.3V. Data lines 42 and 52 typically receive one bit of data from memory. An equalization transistor 48 is connected between the sources of transistors 44 and 54 forming nodes 58 and 60. The source of transistor 44 is also connected to the drain of transistor 64 and cross-connected to the gate 70 of transistor 68. Likewise, the source of transistor 54 is connected to the drain of transistor 68, which is also cross-connected to the gate 66 of transistor 64. The sources of transistors 64 and 68 are then connected to ground 74 (logic state false). As illustrated in FIG. 2, node 58 between transistors 44 and 64 produces the sense amplified (SA) output signal line 62 which is connected to the corresponding SA signal line 62 of the second stage of the amplifier. Likewise, node 60 between transistors 54 and 68 produces the complementary sense amplified ($\overline{SA}$) output signal line 72 which is connected to the corresponding ($\overline{SA}$) signal line 72 of the second stage of the amplifier. It should also be noted that in the preferred embodiment of first stage sense amplifier 40, all of the transistors disclosed are N-channel enhancement type MOSFET transistors. However, one skilled in the art will appreciate that many different types of transistors could be substituted without deviating from the scope of the present invention.

Figure 3:
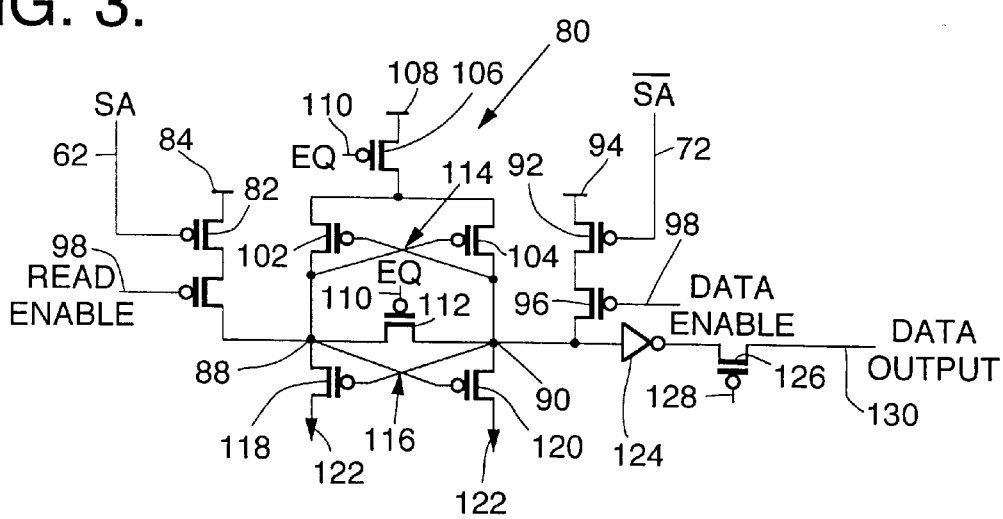
FIG. 3 is a schematic diagram of the second stage of the split sense amplifier and staging buffer in accordance with a preferred embodiment of the present invention.

Referring now to FIG. 3, the second stage 80 of the sense amplifier and staging buffer 100 is disclosed. More particularly, SA signal line 62 is connected to the gate of p-channel transistor 82. The source of transistor 82 is connected to true logic node 84, preferably 3.3V, and the drain of transistor 82 is connected to p-channel read enable transistor 86. The drain of read enable transistor 86 is connected to node 88 which is also connected to the gates of transistors 104 and 120. As with the SA signal side of the second stage 80, $\overline{SA}$ signal line 72 is connected to the gate of p-channel transistor 92. The source of transistor 92 is connected to true logic node 94, also preferably 3.3V, and the drain of transistor 92 is connected to the source of p-channel read enable transistor 96. The drain of read enable transistor 96 is connected to node 90 which is commonly connected to the upper and lower gates of transistors 102 and 118, respectively.

Node 88 controls the gate of transistor 104, and node 90 controls the gate of transistor 102, thereby forming upper cross-connected transistor pair 114. Likewise, node 88 also controls the gate of transistor 120 and node 90 controls the gate of transistor 118, thereby forming lower cross-connected transistor pair 116. A p-channel EQ transistor 106 is connected between true logic voltage node 108 and the common source connection of upper cross-connected transistors 102 and 104. EQ signal line 110 is connected to the gate of upper EQ transistor 106. An n-channel EQ transistor 112 is connected between DO node 88 and $\overline{DO}$ node 90. The commonly connected EQ signal line 110 is connected to the gate of lower EQ transistor 112.

With respect to upper cross-connected transistor pair 114, the drain of transistor 104 is cross-connected to the gate of transistor 102, and the drain of transistor 102 is cross-connected to the gate of transistor 104. Referring to lower cross-connected transistor pair 116, the drain of transistor 118 is cross-connected to the gate of transistor 120, and the drain of transistor 120 is cross-connected to the gate of transistor 118. The sources of transistors 118 and 120 are connected to ground node 122. As disclosed, upper cross-connected transistor pair 114 is formed using p-channel transistors (MOSFETs), and lower cross-connected transistor pair 116 is formed using n-channel transistors (MOSFETs). Moreover, the upper and lower cross-connected pairs of transistors 114, 116 effectively creates a staging buffer or memory latch for storing one bit of data. Accordingly, one skilled in the art will recognize the advantages achieved by the present invention, namely the low power consumption and the reduced number of transistors required to implement the second stage sense amplifier and staging buffer combination. Additional benefits of this improved circuit design will be discussed in more detail below.

With continued reference to FIG. 3, node 90 is connected to the input of inverter 124. The output of inverter 124 connects to the appropriate data output line 130 through output transistor 126. The transfer of one data bit stored in staging buffer 80 to the data output line 130 is controlled by output enable line 128, connected to the gate of output enable transistor 126. While it is preferred to use an inverter 124, one skilled in the art will appreciate that inverter 124 can be replaced with a standard buffer (not shown), if the desired output logic signal needs to be the inverse of the input signal on D line 42.

Figure 4:
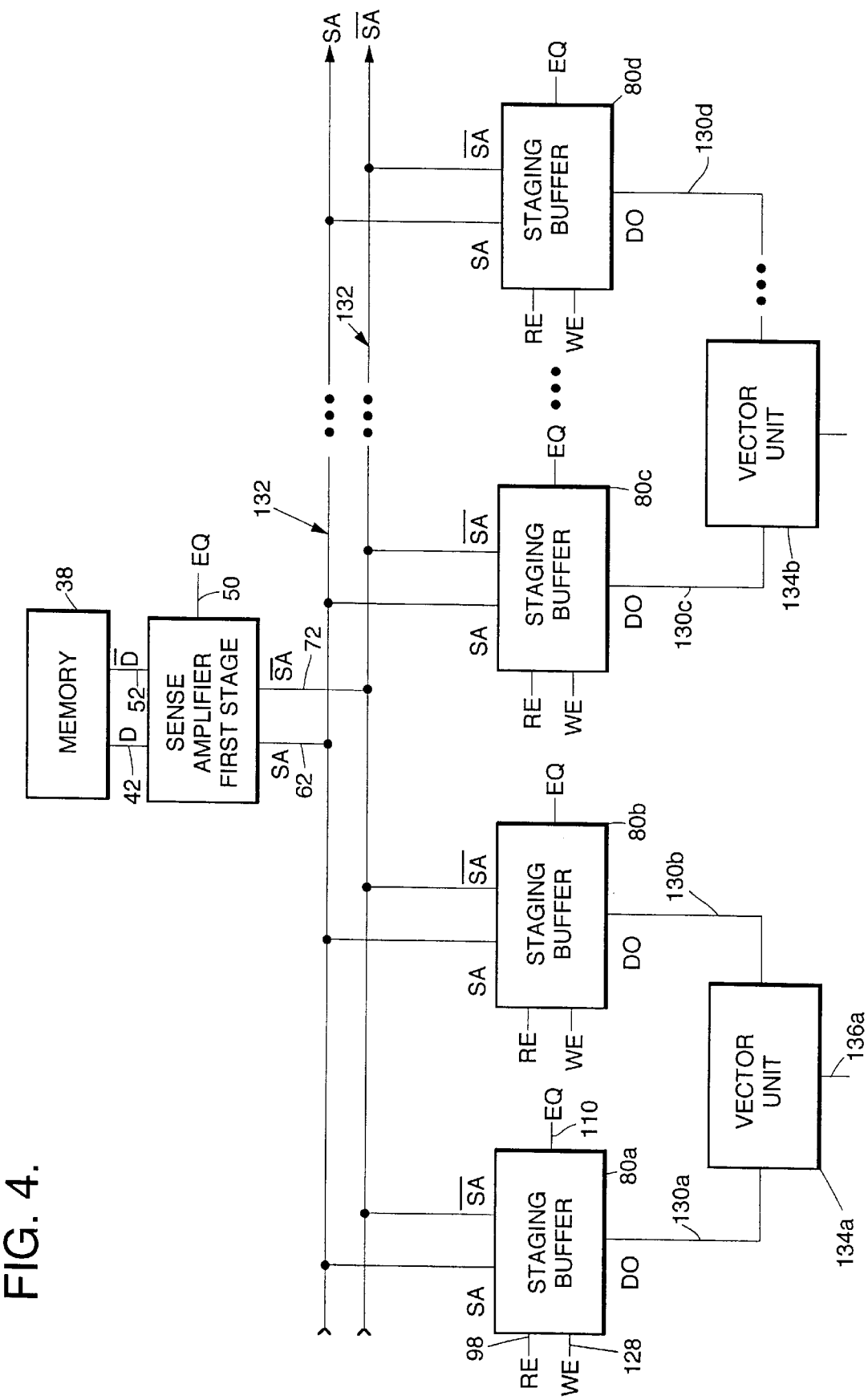
FIG. 4 is a block diagram of an N-port split sense amplifier and staging buffer which can be realized according to the teachings of the present invention.

Referring now to FIG. 4, a block diagram of an N-port split sense amplifier and staging buffer is described in more detail. More particularly, first stage sense amplifier 40 is connected between a memory 38 via D line 42 and $\overline{D}$ line 52, and a common data bus 132 via SA data line 62 and $\overline{SA}$ data line 72. FIG. 4 illustrates four staging buffers 80a through 80d, all commonly connected to common data bus 132. More importantly, however, FIG. 4 represents that N staging buffers can be connected between a memory 38 and sense amplifier 40 via common data bus 132 and the vector units 134a and 134b of a parallel or vector processor. Accordingly, the exact number of staging buffers allocated to a particular vector unit will depend upon the requirements of the vector processor. An exemplary vector processor and memory architecture which is compatible with the staging buffer design of the present invention is that disclosed in U.S. application Ser. No. 08/840,178 filed Apr. 11, 1997 and entitled "Wide Memory Architecture for Vector Processing" commonly owned by the Assignee of the present invention, the disclosure of which is expressly incorporated herein by reference.

In operation, the memory unit 38, designed to support an exemplary vector processor, is connected to a dedicated first stage sense amplifier 40. Prior to the particular vector unit 134a–134b performing a given instruction, a block of data operands can be transferred or pre-loaded from the memory unit 38 to a particular staging buffer via the sense amplifier 40. The vector processor is made up of one or more vector units 134a, 134b. The vector units are then made up of execution blocks (not shown). Because a parallel processor, such as a vector or FFT processor, is designed to perform computationally intensive algorithms, it produces many intermediate results, which are then used by subsequent execution blocks of the vector unit. In a particular application, an execution block may require two or more data operands upon which it performs a predetermined instruction or operation. An example might be multiplying two numbers.

Data is transferred from the memory unit 38 during one or more consecutive clock cycles, through sense amplifier 40, and into the selected staging buffers 80a–80d through common data bus 132. The particular staging buffers identified for receiving data operands from memory 38 are selected by enabling the appropriate read enable (RE) line or lines 98 through conventional memory addressing techniques. While FIG. 4 represents N staging buffers connected to a single sense amplifier 40, the actual number of staging buffers is typically optimized to the requirements of the particular vector unit. For purposes of this disclosure, a vector unit represents functions like an arithmetic logic unit or an accumulator unit.

Once the staging buffers 80a–80d are preloaded with vector operands, vector unit 134a may read two vector operands, one each from staging buffers 80a and 80b, through data output lines 130a and 130b during a single clock cycle. The vector operands can be transferred from the particular staging buffers to the vector unit 134a by enabling the appropriate write enable (WE) line or lines 128 through conventional memory addressing techniques. After operating upon these vector operands, the intermediate result produced by vector unit 134a will be transferred via vector unit output 136a to a selected staging buffer, such as staging buffer 80b, through a separate data bus (not shown).

The conventional approach to implementing staging buffers was to transfer the data through a two-stage sense amplifier to boost the data signal from its signal level as stored in the memory to the full swing voltage level, preferably 0V or 3.3V. The amplified data signal was then transferred to a separate staging buffer at the full swing voltage level. The design of the present invention eliminates the need for a separate staging buffer by combining this circuit function with the second stage of the sense amplifier. The design further allows the data signal to be transferred from the memory to the staging buffers at the memory voltage level, which is significantly less that the full swing voltage level. This technique of transferring the data signal at a voltage level which is lower than the full swing voltage level further allows the data signal to be transferred to the staging buffers at a lower power level. This design also eliminates the additional transistors and data lines required to implement separate staging buffers. Thus, the present invention utilizes the efficiency of high speed staging buffers as an intermediate memory device without increasing the power requirements or capacitive loading on the integrated memory circuit.

Figure 5:
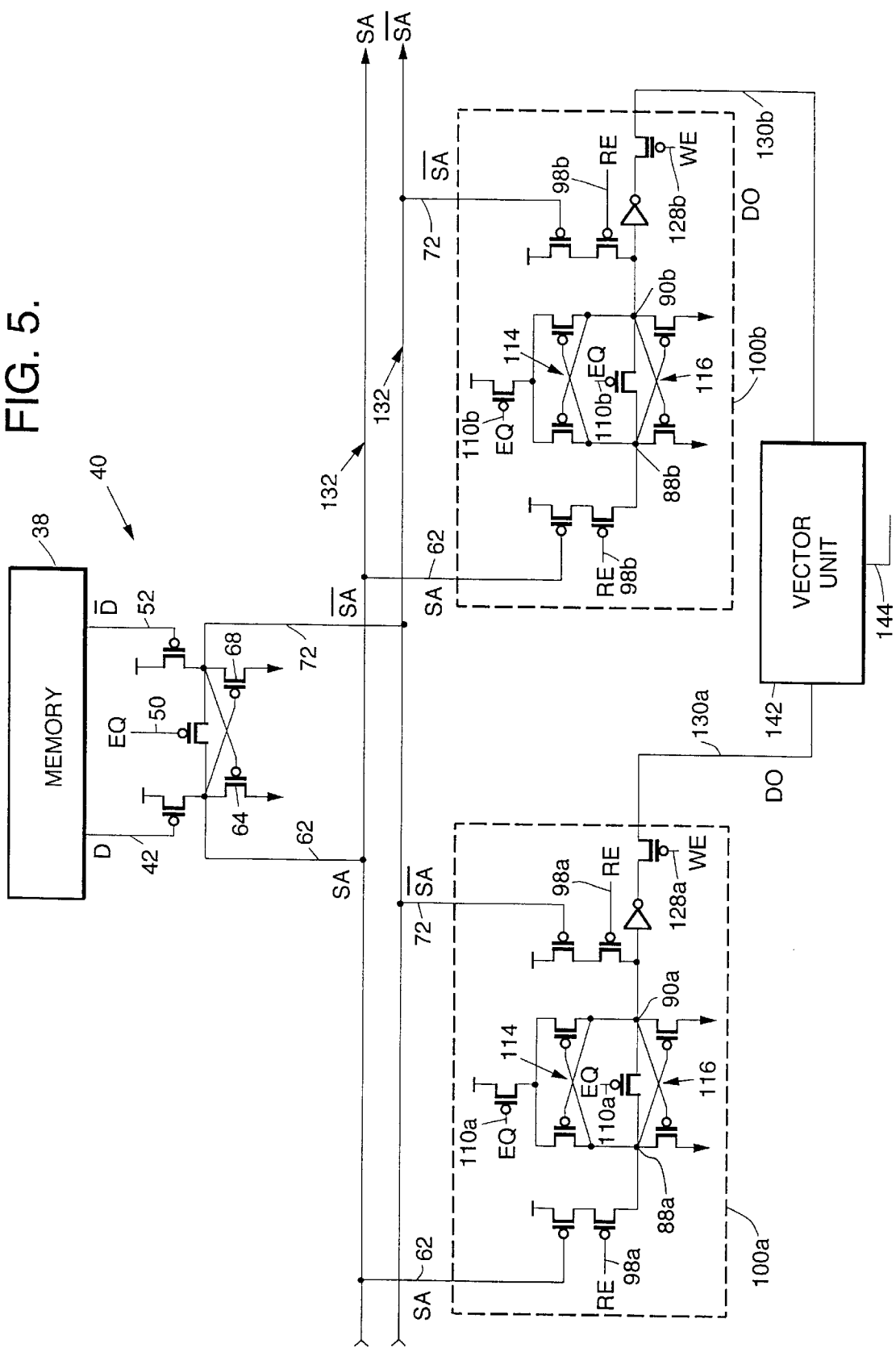
FIG. 5 is a schematic diagram of a two-port split sense amplifier and staging buffer according to a preferred embodiment of the present invention.

With reference to FIG. 5, the preferred embodiment of the sense amplifier and staging buffer is disclosed. More specifically, FIG. 5 illustrates the preferred split sense amplifier and staging buffer design 140 for supporting the transfer of data operands between a memory 38 and a single vector unit 142 of a parallel processor. Additionally, it should be noted that the two staging buffers illustrated in this preferred embodiment have been optimized for the particular vector unit 142. Staging buffer 100a is designated as a read staging buffer memory cell, and staging buffer 100b is designated as a read/write staging buffer memory cell.

One of the significant advantages of the present invention is that the transfer or preloading of the vector operands from the memory unit 38 to the staging buffers 100a and 100b through sense amplifier 40 is performed at the existing signal voltage level as it is received from the memory unit 38, and not at the full swing voltage level, thus conserving power and reducing the total noise on the chip. More specifically, the vector operands are transferred from the memory unit 38 to the staging buffers 100a and 100b as follows. During the rising edge of the clock cycle, and prior to sensing the data signal by sense amplifier 40, an equalization pulse is presented on equalization lines 50 and 110a, which will equalize nodes SA and $\overline{SA}$ 62, 72 and also data nodes 88a and 90a of staging buffer 100a to the same potential. During the clock cycle, commonly connected read enable lines 98a are turned on so that the voltage difference on D line 42 and $\overline{D}$ line 52 will be amplified by the two cross connected transistors 64 and 68 to a magnitude of approximately 330–600 mV on SA and $\overline{SA}$ lines 62, 72. This voltage difference is sufficient to trigger the two pairs of upper and lower cross connected transistors 114 and 116 of staging buffer 100a to settle to their correct value after a determined clock cycle sensing time. It should be noted that nodes 88a and 90a will have the full swing of the supply voltage, if the sensing time clock cycle period is sufficiently long. During the next sequence of clock cycles, staging buffer 100b will be loaded with vector operands from memory 38 through sense amplifier 40 in a similar fashion. Accordingly, one skilled in the art will readily recognize the reduction in power achieved by transferring a vector operand signal from memory unit 38 through first stage sense amplifier 40 for temporary storage in staging buffers 100a or 100b at a voltage level significantly less than the conventional full swing voltage level. It should also be pointed out that the integration of a staging buffer into the second stage of the sense amplifier reduces the total number of transistors required to implement a memory storage cell, and also significantly reduces the routing complexity of the data signal lines of the integrated memory circuit.

With continued reference to FIG. 5, the vector unit 142 will then read the data operand values preloaded in staging buffers 100a and 100b during a single clock cycle. This is accomplished by addressing staging buffers 100a and 100b through write enable lines 128a and 128b and transferring the vector operands to the vector unit 142 through data output lines (DO) 130a and 130b. Staging buffers 100a and 100b provide a data signal to vector unit 142 at the full swing voltage level. The vector unit 142 then performs its function on the two operands, and the intermediate result is transferred via vector unit output 144 to staging buffer 100b through a vector unit output data bus (not shown).

The foregoing discussion discloses and describes exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A memory architecture comprising:
a memory for storing an array of data at a first voltage level;
a first amplifier stage connected to the memory, the first amplifier stage including a pair of cross-connected transistors with an equalization transistor connected therebetween, the first amplifier stage having a pair of complimentary data input lines and a pair of complimentary data output lines, the first amplifier stage further having a pair of signal driving transistors, wherein each of the data input lines is connected to one of the signal driving transistors, and the output of each signal driving transistor is connected to one of the cross-connected transistors, the first amplifier stage receiving a data signal from the memory at the first voltage level and increasing the voltage level of the data signal to a second voltage level;
a plurality of second amplifier stages connected to the first amplifier stage, each of the second amplifier stages having a data input line, a complementary data input line, and a data output line, each of the second amplifier stages further including a memory latch for receiving the data signal from the first amplifier stage and storing at least one bit of data upon strobing at least one read enable line, and writing said data to an output data bus upon strobing at least one write enable line, each of the second amplifier stages receiving the data signal from the first amplifier stage at the second voltage level and increasing the voltage level of the data signal to a buffer voltage level; and
a common data bus connecting the first amplifier stage with the plurality of second amplifier stages, wherein the data signal is transferred across the data bus from the first amplifier stage to one of the second amplifier stages at the second voltage level, and wherein the first voltage level and the second voltage level are substantially lower than the buffer voltage level.

2. The memory architecture of claim 1 wherein said memory latch further includes a first pair of cross-connected transistors connected to a second pair of cross-connected transistors.

3. The memory architecture of claim 2 wherein said second amplifier stage includes a read enable transistor connected between said data input line of said second amplifier stage and said first and second pair of cross-connected transistors.

4. The memory architecture of claim 2 wherein said first pair of cross-connected transistors are p-channel MOSFET transistors.

5. The memory architecture of claim 2 wherein said second pair of cross-connected transistors are n-channel MOSFET transistors.

6. The memory architecture of claim 2 wherein said second amplifier stage includes an equalization transistor connected between said first pair of cross-connected transistors.

7. The memory architecture of claim 2 wherein said second amplifier stage includes an equalization transistor connected between said second pair of cross-connected transistors.

8. The memory architecture of claim 1 wherein said second amplifier stage includes an inverter connected between said memory latch and said output data bus.

9. The memory architecture of claim 1 wherein said second amplifier stage includes a buffer connected between said memory latch and said output data bus.

10. A memory architecture comprising:
a memory for storing an array of data at a first voltage level;
a sense amplifier connected to the memory, the sense amplifier including a pair of cross-connected transistors, and an equalization transistor connected therebetween, the first amplifier stage having a pair of complimentary data input lines and a pair of complimentary data output lines, the sense amplifier stage further having a pair of signal driving transistors, wherein each of the data input lines is connected to one of the signal driving transistors, and the output of each signal driving transistor is connected to one of the cross-connected transistors, the sense amplifier receiving a data signal from the memory at the first voltage level and increasing the voltage level of the data signal to a second voltage level;

a pair of staging buffers connected to the sense amplifier, each of the staging buffers having a data input line, a complementary data input line, and a data output line, each of the staging buffers further including a memory latch for receiving the data signal from the sense amplifier and storing at least one bit of data upon strobing at least one read enable line, and writing said data to a vector unit upon strobing a pair of write enable lines, the staging buffers being individually responsive to address decoding circuitry, the staging buffers receiving the data signal from the sense amplifier at the second voltage level and increasing the voltage level of the data signal to a buffer voltage level for temporary storage in the memory latch; and a common data bus connecting the sense amplifier with the pair of staging buffers, said common data bus including a data line and a complimentary data line, wherein the data signal is transferred across the data bus from the sense amplifier to one of the staging buffers at the second voltage level, and wherein the first voltage level and the second voltage level are substantially lower than the buffer voltage level for reducing a power consumption level of the memory architecture.

11. The memory architecture of claim 10 wherein said memory latch further includes a first pair of cross-connected transistors connected to a second pair of cross-connected transistors.

12. The memory architecture of claim 11 wherein said staging buffers include a pair of read enable transistors connected between said data input lines of said staging buffers and said first and second pair of cross-connected transistors.

13. The memory architecture of claim 11 wherein said staging buffers include an equalization transistor connected between said first pair of cross-connected transistors.

14. The memory architecture of claim 11 wherein said staging buffers include an equalization transistor connected between said second pair of cross-connected transistors.

15. The memory architecture of claim 10 wherein said staging buffers include an inverter connected between said memory latch and said vector unit.

16. The memory architecture of claim 10 wherein said staging buffers include a buffer connected between said memory latch and said vector unit.

17. The memory architecture of claim 10 wherein a single circuit forming each of the staging buffers is used for amplifying and storing the data signal at the buffer voltage level.

* * * * *